United States Patent
Cheng et al.

(10) Patent No.: US 10,777,525 B1
(45) Date of Patent: Sep. 15, 2020

(54) FILP CHIP PACKAGE

(71) Applicant: HIMAX TECHNOLOGIES LIMITED, Tainan (TW)

(72) Inventors: Pai-Sheng Cheng, Tainan (TW); Wen-Chieh Tu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/365,710

(22) Filed: Mar. 27, 2019

(51) Int. Cl.
    *H01L 23/00*     (2006.01)
    *H01L 23/538*     (2006.01)
    *H01L 23/10*     (2006.01)
    *H01L 23/498*     (2006.01)
    *H01L 23/31*     (2006.01)

(52) U.S. Cl.
    CPC .............. *H01L 24/17* (2013.01); *H01L 23/10* (2013.01); *H01L 23/49838* (2013.01); *H01L 23/5386* (2013.01); *H01L 24/09* (2013.01); *H01L 23/3157* (2013.01)

(58) Field of Classification Search
    None
    See application file for complete search history.

(56) References Cited

U.S. PATENT DOCUMENTS

2015/0041969 A1*   2/2015   Chang ................. H01L 25/0655
                                                                                                        257/734

FOREIGN PATENT DOCUMENTS

| TW | 200929482 | 7/2009 |
| TW | 201832328 | 9/2018 |
| TW | 201916304 | 4/2019 |

OTHER PUBLICATIONS

"Office Action of Taiwan Counterpart Application," dated Dec. 23, 2019, p. 1-p. 6.

* cited by examiner

*Primary Examiner* — Evren Seven
(74) *Attorney, Agent, or Firm* — JCIPRNET

(57) ABSTRACT

A flip chip package includes a substrate, a chip body bonding on the substrate and bumps connected between the chip body and the substrate. The substrate includes input wires and output wires. The chip body includes a first package unit including a first seal ring and first pads and a second package unit including a second seal ring and second pads. The chip body extends continuously between the first seal ring and the second seal ring. Each of the input wires has one end overlapping the chip body and the other end positioned at a first bonding region of the substrate. Each of the output wires has one end overlapping the chip body and the other end positioned at a second bonding region of the substrate. The first bonding region and the second bonding region are located at opposite sides of the chip body.

20 Claims, 6 Drawing Sheets

FILP CHIP PACKAGE

BACKGROUND

Technical Field

The disclosure is related to a semiconductor package, and particularly, to a flip chip package.

Description of Related Art

For the application in high resolution electronic devices, there is increasing demand for high output pin count of an integrated circuits (IC) chip. Among kinds of the package technology, the flip-chip bonding technology is commonly used for a high output pin count IC chip because the flip-chip bonding technology utilizes the solder/gold/Cu pillar bumps arranged on the active surface of the chip, which facilitates to achieve a large number of contacts and high contact density on a chip package. In addition, compared with the wire bonding technology, the solder/gold/Cu pillar bumps can provide shorter transmission paths between the chip and the carrier substrate so as to present a desirable performance.

However, restricted by the manufacturing limits and the manufacturing cost, the contact density of the IC chip is not easy to be modified. For having further higher output pin count with a compact package, there are still rooms for improving the chip package technology.

SUMMARY

The disclosure is directed to a flip chip package having high output pin count and compact volume.

According to an embodiment of the disclosure, a flip chip package includes a substrate, a chip body bonding on the substrate and a plurality of bumps connected between the chip body and the substrate. The substrate includes a plurality of input wires and a plurality of output wires. The chip body includes a first package unit and a second package unit. The first package unit includes a first seal ring and a plurality of first pads positioned inside a region surrounded by the first seal ring. The second package unit includes a second seal ring and a plurality of second pads positioned inside a region surrounded by the second seal ring. The chip body extends continuously between the first seal ring and the second seal ring. Each of the input wires has one end overlapping the chip body and the other end positioned at a first bonding region of the substrate. Each of the output wires has one end overlapping the chip body and the other end positioned at a second bonding region of the substrate. The first bonding region and the second bonding region are located at opposite sides of the chip body.

In an embodiment of the disclosure, the first pads are arranged in a ring path inside the region surrounded by the first seal ring.

In an embodiment of the disclosure, the first pads are arranged in a ring path surrounded by the second seal ring.

According to an embodiment of the disclosure, a flip chip package includes a substrate, a chip body bonding on the substrate and a plurality of bumps connected between the chip body and the substrate. The substrate includes a plurality of input wires and a plurality of output wires. The chip body includes a first package unit and a second package unit. The first package unit includes a plurality of first pads arranged in a first ring path, the second package unit includes a plurality of second pads arranged in a second ring path, and a distance from a closest one of the first pads closest to the second pads to a closest one of the second pads closest to the first pads is in a range of 55 μm to 1000 μm. Each of the input wires has one end overlapping the chip body and the other end positioned at a first bonding region of the substrate. Each of the output wires has one end overlapping the chip body and the other end positioned at a second bonding region of the substrate. The first bonding region and the second bonding region are located at opposite sides of the chip body.

In an embodiment of the disclosure, the bumps includes an interconnecting bump extending between the first package unit and the second package unit, one end of the interconnecting bump is connected to one of the first pads and the other end of the interconnecting bump is connected to one of the second pads.

In an embodiment of the disclosure, the substrate further includes an interconnecting wire. One end of the interconnecting wire is connected to one of the first pads and the other end of the interconnecting wire is connected to one of the second pads.

In an embodiment of the disclosure, the first seal ring and the second seal ring are spaced from each other by a distance and the distance ranges from 50 μm to 200 μm.

In an embodiment of the disclosure, the first pads includes a plurality of first input pads, the second pads includes a plurality of second input pads, the first input pads are respectively connected to a portion of the input wires, and the second input pads are respectively connected to the other portion of the input wires.

In an embodiment of the disclosure, one of the first pads is a first dummy pad positioned more adjacent to the second seal ring than the other of the first input pads and one of the second pads is a second dummy pad positioned more adjacent to the first seal ring than the other of the second input pads.

In an embodiment of the disclosure, a length of the chip body ranges from 28 mm to 66 mm.

In an embodiment of the disclosure, a distance from one of the first pads farthest from the second seal ring to one of the second pads farthest from the first seal ring is in a range of 27 mm to 65 mm.

In an embodiment of the disclosure, a distance from one of the first pads closest to the second seal ring to one of the second pads closest to the first seal ring is in a range of 55 μm to 1000 μm.

In an embodiment of the disclosure, the chip body further includes a peripheral circuit positioned between the first seal ring and the second seal ring.

In view of the above, the single chip body in the flip chip package in accordance with an embodiment of the disclosure includes more than one package unit so as to provide higher contact density for the flip chip package while the volume of the flip chip package need not be significantly enlarged. Accordingly, the flip chip package in accordance with an embodiment of the disclosure is able to provide more output pin count in a compact volume.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 schematically illustrates a cross section of a flip chip package in accordance with an embodiment of the disclosure.

DESCRIPTION OF THE EMBODIMENTS

Figure 1:
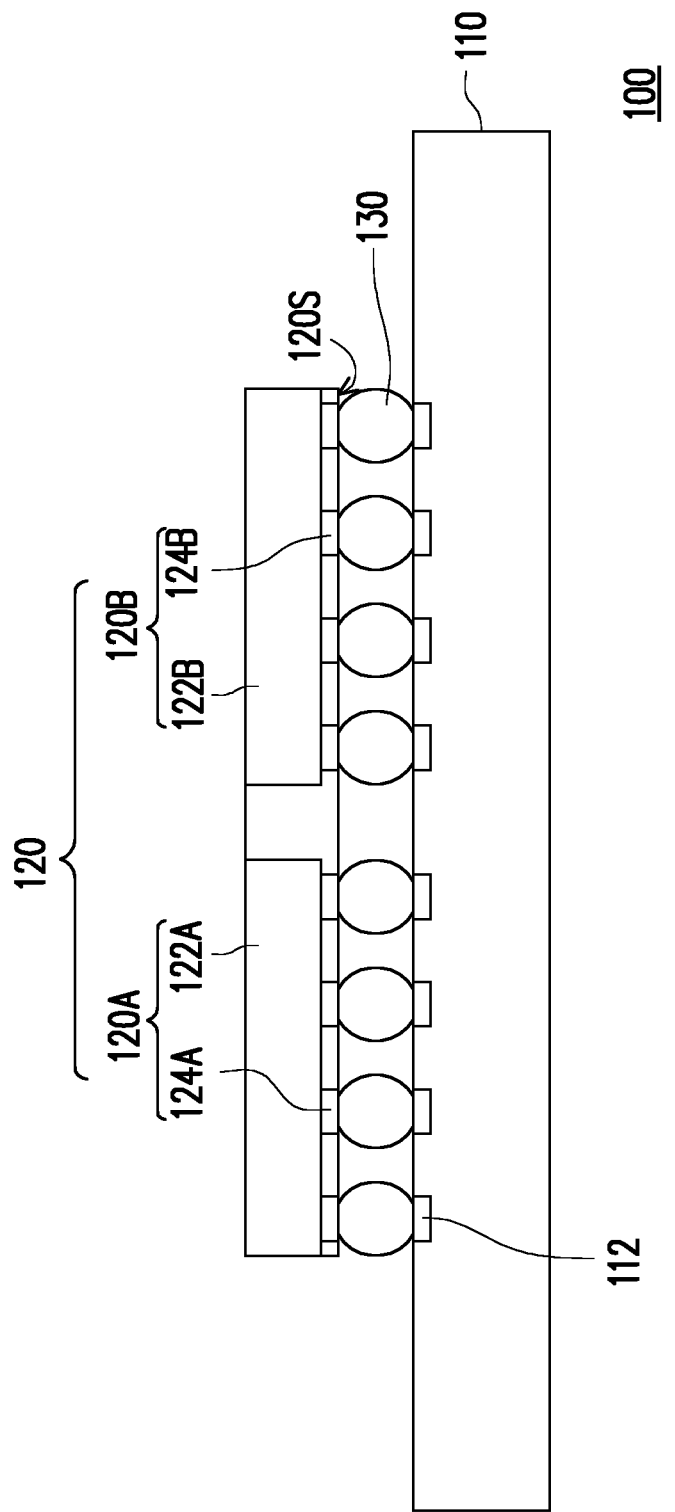

FIG. 1 schematically illustrates a cross section of a flip chip package in accordance with an embodiment of the disclosure. Referring to FIG. 1, a flip chip package 100 may include a substrate 110, a chip body 120 bonding on the substrate 110 and a plurality of bumps 130. The chip body 120 may be bonded on the substrate 110 through the bumps 130 in a manner that an active surface 120S of the chip body 120 faces the substrate 110. The bumps 130 may be gold bump, solder bumps, copper bumps or similar metal bumps, and the chip body 120 may be connected by tin-gold eutectic bonding method, ACF (Anisotropic Conductive Film) bonding method, SMT (Surface-mount technology) reflow method to be electrically connected to the substrate 110 through the bumps 130. The substrate 110 may be a FPC (Flexible Printed Circuit) film, a BGA (Ball Grid Array) substrate, a COF (Chip On Film) tape or a COG (Chip On Glass) glass substrate and include a plurality of wires 112 formed thereon. The chip body 120 may include a first package unit 120A and a second package unit 120B.

The first package unit 120A includes a first semiconductor element 122A, such as a die with corresponding circuit layout, and a plurality of first pads 124A for providing the electric transmission path of the first semiconductor element 122A and the second package unit 120B includes a second semiconductor element 122B, such as a die with corresponding circuit layout, and a plurality of second pads 124B for providing the electric transmission path of the second semiconductor element 122B. Specifically, the first package unit 120A and the second package unit 120B are encapsulated and singulated together to be a single chip body 120.

The first pads 124A and the second pads 124B respectively connect to the bumps 130 so that the first semiconductor element 122A and the second semiconductor element 122B may be electrically connected to the wires 112 through the first and the second pads 124A and 124B and the bumps 130. The cross section of the flip chip package 100 shown in FIG. 1 may be an example for illustrating the disposition relationship of the semiconductor elements, the pads, the bumps, and the wires, but the disclosure is not limited thereto. In accordance with some alternative embodiments, a flip chip package may include other components that are not described in FIG. 1.

Figure 2:
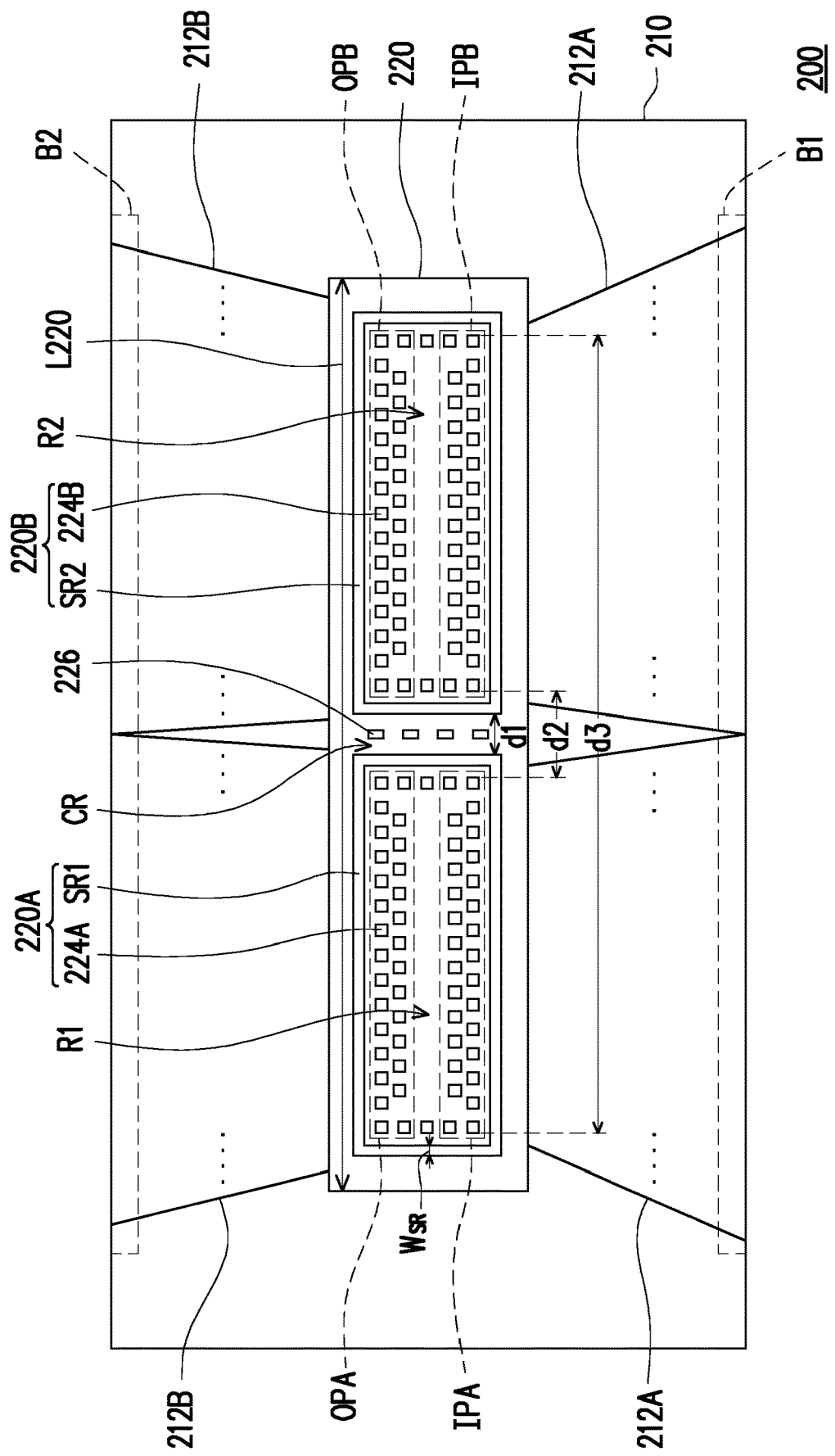
FIG. 2 schematically illustrates a plane view of a flip chip package according to an embodiment of the disclosure.

FIG. 2 schematically illustrates a plane view of a flip chip package according to an embodiment of the disclosure. In the embodiment of FIG. 2, a flip chip package 200 may include a substrate 210, a chip body 220 bonding on the substrate 210 and a plurality of bumps (not shown). The substrate 210 may be a FPC (Flexible Printed Circuit) film, a BGA (Ball Grid Array) substrate, a COF (Chip On Film) tape or a COG (Chip On Glass) glass substrate and include a plurality of input wires 212A and a plurality of output wires 212B. The chip body 220 includes a first package unit 220A and a second package unit 220B. In the embodiment, each of the input wires 212A has one end overlapping the chip body 220 and the other end positioned at a first bonding region B1 of the substrate 210 and each of the output wires 212B has one end overlapping the chip body 220 and the other end positioned at a second bonding region B2 of the substrate 210, wherein the first bonding region B1 and the second bonding region B2 are located at opposite sides of the chip body 220. The plane view of the flip chip package 200 shown in FIG. 2 may omit some components for descriptive purpose, but some of the omitted components may refer to FIG. 1. For example, the flip chip package 200 shown in FIG. 2 also includes the bumps 130 shown in FIG. 1 for connecting the chip body 220 to the first and the second wires 212A and 212B on the substrate 210.

In FIG. 2, the first package unit 220A includes a first seal ring SR1 and a plurality of first pads 224A positioned inside a region R1 surrounded by the first seal ring SR1. The second package unit 220B includes a second seal ring SR2 and a plurality of second pads 224B positioned inside a region R2 surrounded by the second seal ring SR2. The chip body 220 extends continuously between the first seal ring SR1 and the second seal ring SR2. In other words, the chip body 220 is an individual single packaged body. FIG. 2 omits some components of the chip body 220, but some of the omitted component may refer to FIG. 1. For example, the chip body 220 shown in FIG. 2 also includes the semiconductor elements similar to the first semiconductor element 122A and the second semiconductor element 122B shown in FIG. 1 and the first pads 224A and the second pads 224B are electrically connected to the semiconductor elements. In addition, each of the first pads 224A may connect to one bump, similar to the bump 130 in FIG. 1, to be electrically connected to a corresponding one of the input wires 212A and the output wires 212B, and each of the second pads 224B may connect to one bump, similar to the bump 130 in FIG. 1, to be electrically connected to a corresponding one of the input wires 212A and the output wires 212B.

Specifically, the plane view of the flip chip package shown in FIG. 2 may serve as an implement example for the plane layout of some components of the flip chip package 100 of FIG. 1. Specifically, the input wires 212A and the output wires 212B may be corresponding to the wires 112 of FIG. 1 and the first pads 224A and the second pads 224B may be corresponding to the first pads 124A and the second pads 124B of FIG. 1.

In FIG. 2, though the semiconductor elements are not shown, the first package unit 220A may be considered as a portion where a first semiconductor element is encapsulated and the first semiconductor element may be positioned within the region R1 surrounded by the first seal ring SR1. Similarly, the second package unit 220B may be considered as a portion where a second semiconductor element is encapsulated and the second semiconductor element may be positioned within the region R2 surrounded by the second seal ring SR2. In other words, the first package unit 220A and the second package unit 220B may be considered as two independent package units each of which includes an independent semiconductor element therein.

In the process of manufacturing the chip body 220, a plurality of package units are arranged in an array and integrally encapsulated in a mother package while two adjacent package units are spaced from each other by a predetermined cutting region. Subsequently, the mother package is cut along the predetermined cutting region to form individual chip body, which is known as a singulation process. The first seal ring SR1 and the second seal ring SR2 in the embodiment may define the first package unit 220A and the second package unit 220B and may protect the components in each package unit. Specifically, the region CR between the first seal ring SR1 and the second seal ring SR2 serves as the cutting region of the mother package. In some embodiments, a width $W_{SR}$ of each of the first seal ring SR1 and the second seal ring SR2 may be around 2 µm-30 µm, but the disclosure is not limited thereto. In some alternative embodiments, the seal ring may be omitted and the package units may be determined by the arrangement of the pads or other mark. Usually, in the singulation process, each package unit is singulated from the mother package to form a single body, but in the embodiment, the chip boy 220 is singulated from the mother package by conjoining two or more package units in one single body. Namely, the chip body 220 in the embodiment is embedded with the region CR corresponding to the predetermined cutting region in the mother package. If the chip body 220 is cut along the region CR, two independent chip packages may be obtained.

In the embodiment, a length L220 of the chip body 220 may be in a range of 28 mm to 66 mm. The first seal ring SR1 and the second seal ring SR2 are spaced from each other by a distance d1, which may be similar to the width of the predetermined cutting region of the mother package. Usually, the width of the predetermined cutting region of the mother package is not desired to be large because the larger the predetermined cutting region the more the waste region, which reduces the gross dies. Therefore, the distance d1 may range from 50 µm to 200 µm which would not excessively enlarge the whole volume of the chip body 220. In other words, the chip body 220 may have a compact volume. A distance d2 from one of the first pads 224A closest to the second seal ring SR2 to one of the second pads 224B closest to the first seal ring SR1 may be in a range of 55 µm to 1000 µm. A distance d3 from one of the first pads 220A farthest from the second seal ring SR2 to one of the second pads 224B farthest from the first seal ring SR1 may be in a range of 27 mm to 65 mm. The length L220, the distance d1, the distance d2 and the distance d3 may be determined based on the circuit design of each package unit and not limit to the above number ranges.

In addition, the chip body 220 may further include a peripheral circuit 226 positioned in the region CR between the first seal ring SR1 and the second seal ring SR2. The peripheral circuit 226 may serve as the testing circuit in the mother package and may fail to be enabled after the chip body 220 is singulated. In some embodiments, the peripheral circuit 226 may be covered and/or shielded by a dielectric material so that the peripheral circuit 226 may not be electrically connected to the wires on the substrate 210.

The first package unit 220A and the second package unit 220B are manufactured under the same process and may have identical circuit layout and functions. For example, in the chip body 220, the first pads 224A of the first package unit 220A are arranged in a ring path and so as the second pads 224B of the second package unit 220B. In some alternative embodiments, the pads in each package unit may be arranged in an array. In the first package unit 220A, the ones of the first pads 224A connecting to the input wires 212A may be first input pads IPA, the ones of the first pads 224A connecting to the output wires 212B may be first output pads OPA, and the first input pads IPA are concentrated at a side of the chip body 220 while the first output pads OPA are concentrated at an opposites side of the chip body 220. In addition, no first output pad OPA is interposed between adjacent two of the first input pads IPA and no first input pads IPA is interposed between adjacent two of the first output pads OPA. Similarly, the second pads 224B may be divided into the second input pads IPB connecting to the input wires 212A and the second output pads OPB connecting to the output wires 212B, and the second input pads IPB and the second output pads OPB are concentrated in respective regions.

The chip body 220 including the first package unit 220A and the second package unit 220B encapsulated integrally may provide more input/output channels, compared with the package body including one single package unit. Accordingly, the flip chip package 200 may achieve high output design and facilitate the application of high resolution electronic devices while the volume of the flip chip package 200 is compact. For example, in the case that each of the first package unit 220A and the second package unit 220B provide N output channels, the flip chip package 200 having the chip boy 220 may provide 2N output channels, wherein N is an integer. In addition, the first package unit 220A and the second package unit 220B are integral in the single chip body 220, so that only one bonding process is required to bond the first package unit 220A and the second package unit 220B on the substrate 210, which reduces the manufacturing time span and simplifies the manufacturing process.

Figure 3:
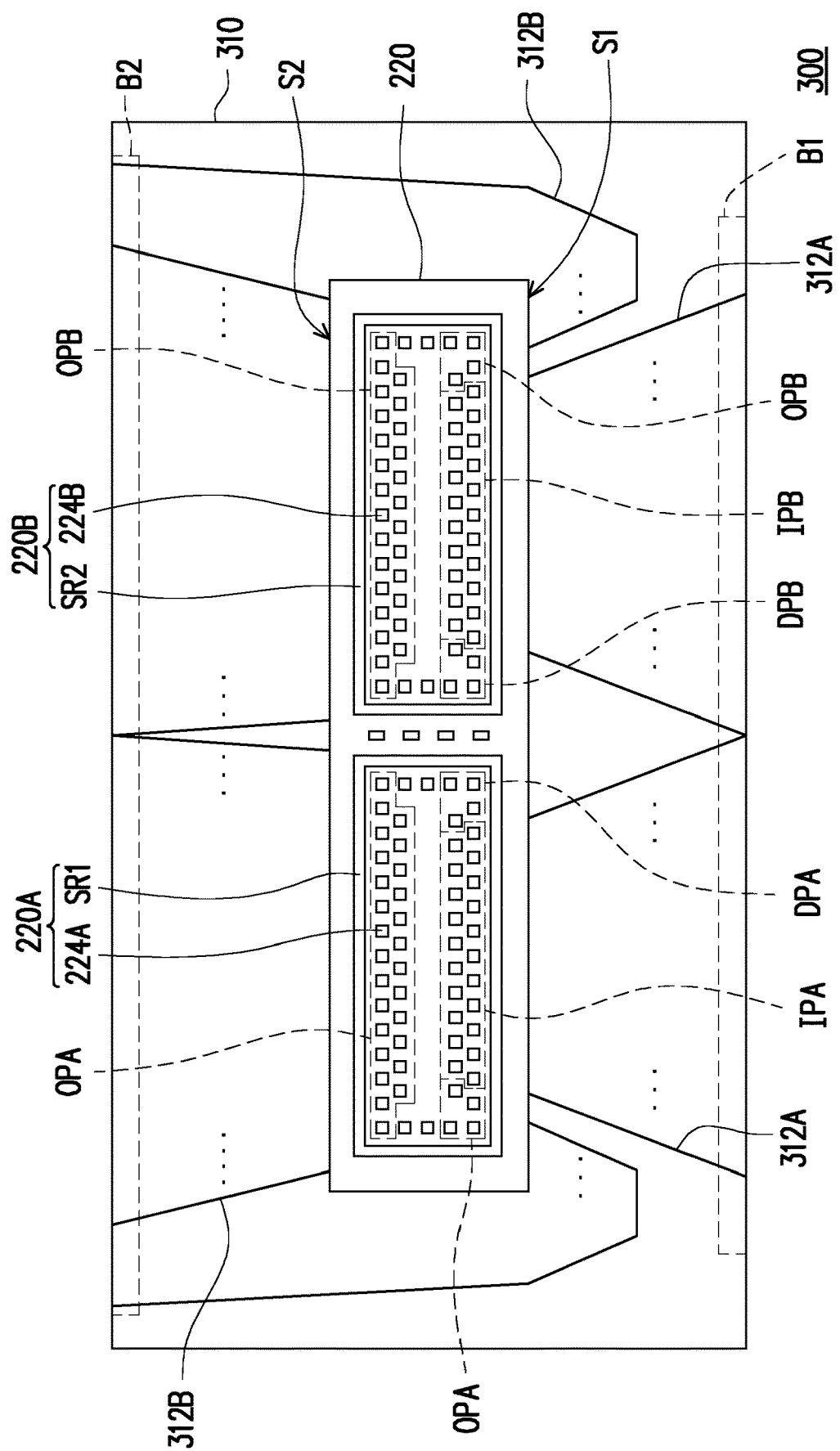
FIG. 3 schematically illustrates a plane view of a flip chip package according to another embodiment of the disclosure.

FIG. 3 schematically illustrates a plane view of a flip chip package according to another embodiment of the disclosure. In the embodiment of FIG. 3, a flip chip package 300 may include a substrate 310, a chip body 220 bonding on the substrate 310 and a plurality of bumps (not shown) connecting between the substrate 310 and the chip body 320. The chip body 320 of the flip chip package 300 is substantially similar to the chip body 220 of the flip chip package 200 shown in FIG. 2 and the same reference numbers in the two drawings represent the same or similar components. Details of the components may refer to the descriptions regarding FIG. 2. In the present embodiment, the input wires 312A and the output wires 312B on the substrate 310 are arranged differently from those on the substrate 210 of FIG. 2.

Specifically, in the embodiment, all of the input wires 312A extend from a first side S1 of the chip body 220 to the bonding region B1, some of the output wires 312B extend from the first side S1 of the chip body 220 to the bonding region B2, and the other of the output wires 312B extend from the opposite, second side S2 of the chip body 220 to the bonding region B2. The ones of the first pads 224A in the first package unit 220A connecting to the input wires 312A are first input pads IPA and the ones of the first pads 224A in the first package unit 220A connecting to the output wires 312B are first output pads OPA. In the embodiment, some of the first output pads OPA are arranged at the first side S1 of the chip body 220 as the first input pads IPA. In addition, some of the first pads 224A positioned between the first input pads IPA and the second seal ring SR2 are first dummy pads DPA. In some embodiment, some of the first dummy pads DPA and some of the first output pads OPA are located at a side of first package unit 220A adjacent to the bonding region B1 and the first input pads IPA are arranged between said first dummy pads DPA adjacent to the bonding region B1 and said first output pads OPA adjacent to the bonding region B1.

Similar to the first package unit 220A, the second pads 224B of the second package unit 220B may be divided into the second input pads IPB connecting to the input wires 312A, the second output pads OPB connecting to the output wires 312B, and the second dummy pads DPB positioned between the second input pads IPB and the first seal ring SR1. Some of the second output pads OPB are positioned at the first side 51 of the chip body 220 as the second input pads IPB, and the second input pads IPB are positioned between the second output pads OPB positioned at the first side 51 and the second dummy pads DPB.

The chip body 220 may be designed as that if the chip body 220 is cut along the region between the first seal ring SR1 and the second seal ring SR2, the first dummy pads DPA and the second dummy pads DPB serve as output pads. However, the chip body 220 is continuous between the first seal ring SR1 and the second seal ring SR2 while the input wires 312A and the output wires 312B are prescribed to extend to the first bonding region B1 and the second bonding region B2 located at opposite sides of the chip body 220, respectively. No output wire 312B extends to reach the first dummy pads DPA and the second dummy pads DPB. Accordingly, the first dummy pads DPA and the second dummy pads DPB are neither connected to the input wire 312A nor connected to the output wire 312B. In some embodiments, the first dummy pads DPA and the second dummy pads DPB may be electrically grounded or floated. In some embodiments, the first dummy pads DPA and the second dummy pads DPB may not be connected to a bump connecting to the substrate 310. In the embodiment, some of the pads located at the first side 51 of the chip body 220 are output pads so that the amount of the output pads may increase to achieve a high output design though there are the first dummy pads DPA and the second dummy pads DPB.

Figure 4:
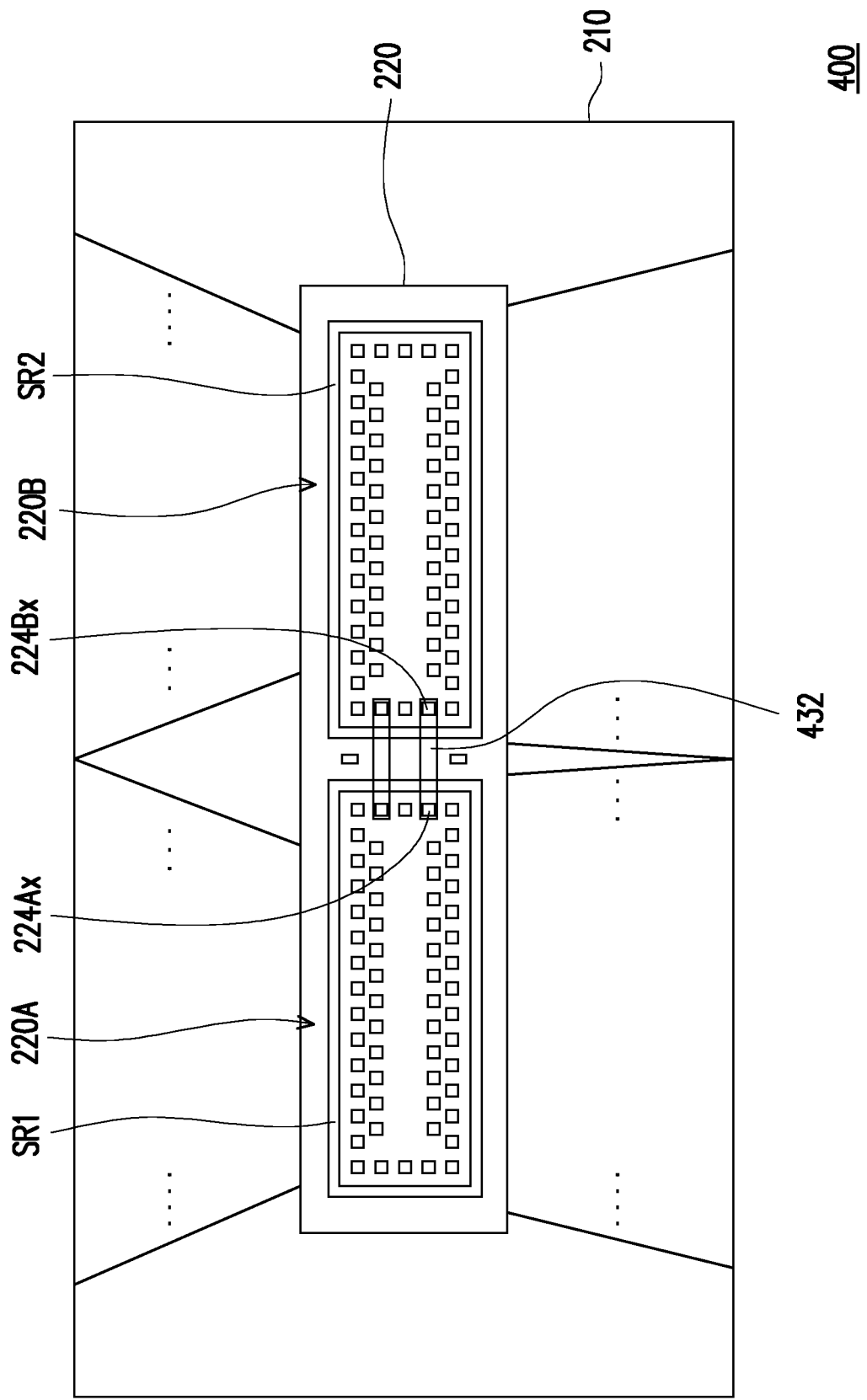
FIG. 4 schematically illustrates a plane view of a flip chip package according to further another embodiment of the disclosure.

FIG. 4 schematically illustrates a plane view of a flip chip package according to further another embodiment of the disclosure. In the embodiment of FIG. 4, a flip chip package 400 is similar to the flip chip package 200 and the same or similar components in the two embodiments are indicated by the same or similar reference numbers. Details of these components may refer to the above descriptions and may be not reiterated here. In the embodiment, the flip chip package 400 may include a substrate 210 and a chip body 220 bonding on the substrate 210, and further includes an interconnecting bump 432. The interconnecting bump 432 may be one of the bumps connected between the pads on the chip body 220 and the wires on the substrate 210. Specifically, the interconnecting bump 432 extends between the first package unit 220A and the second package unit 220B. One end of the interconnecting bump 432 is connected to one of the first pads, the first pad 224Ax, and the other end of the interconnecting bump 432 is connected to one of the second pads, the second pad 224Bx. The first pad 224Ax and the second pad 224Bx may be positioned adjacent to the region between the first seal ring SR1 and the second seal ring SR2 and may be prescribed to transmit the same electric signal or voltage. In some embodiments, the first pad 224Ax and the second pad 224Bx may both be ground pads connecting to a ground voltage or power pads connecting to a power supply source. In some alternative embodiments, the interconnecting bump 432 may be applied to the flip chip package 100 or 300 to connect two pads in the two package units.

Figure 5:
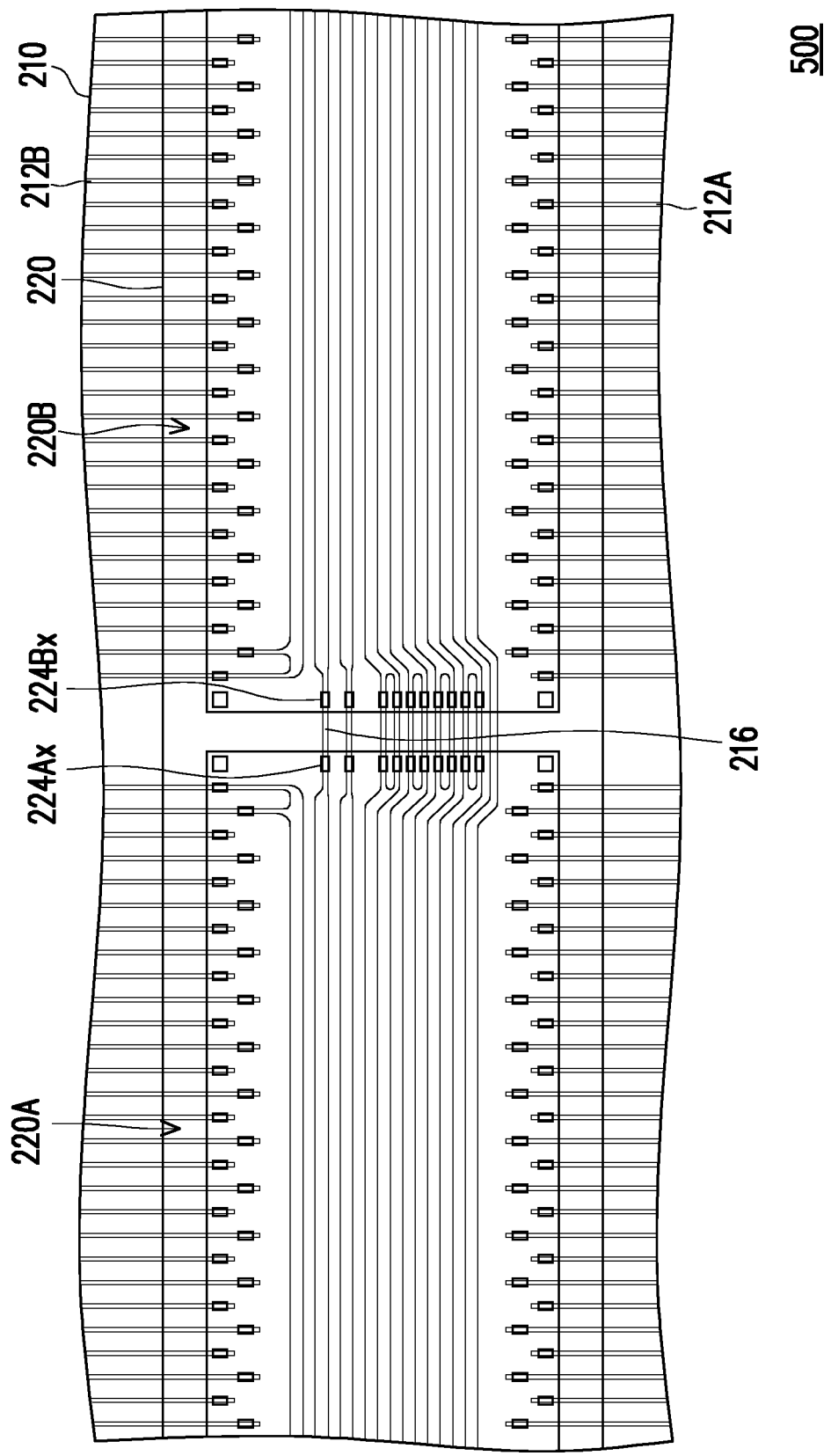
FIG. 5 schematically illustrates a plane view of a portion of a flip chip package according to further another embodiment of the disclosure.

FIG. 5 schematically illustrates a plane view of a portion of a flip chip package according to further another embodiment of the disclosure. In the embodiment of FIG. 5, a flip chip package 500 is similar to the flip chip package 200 and the same or similar components in the two embodiments are indicated by the same or similar reference numbers. Details of these components may refer to the above descriptions and are not reiterated here. In the embodiment, the flip chip package 500 may include a substrate 210 and a chip body 220 bonding on the substrate 210 through a plurality of bumps (not shown), and the substrate 210 includes the input wires 212A, the output wires 212B and an interconnecting wire 216. The interconnecting wire 216 extends between the first package unit 220A and the second package unit 220B and is connected to one of the first pads, the first pad 224Ax, as well as one of the second pads, the second pad 224Bx. The first pad 224Ax of the first package unit 220A and the second pad 224Bx of the second package unit 220B may be positioned adjacent to the region between the first package unit 220A and the second package unit 220B and may be prescribed to transmit the same electric signal or voltage and may be connected to the interconnecting wire 216 through respective bumps or the interconnecting bump 432 shown in FIG. 4. In some embodiments, the first pad 224Ax and the second pad 224Bx may both be ground pads connecting to a ground voltage or power pads connecting to a power supply source. In some alternative embodiments, the interconnecting wire 216 may be applied to the flip chip package 100, 200 or 300 to connect two pads in the two package units.

Figure 6:
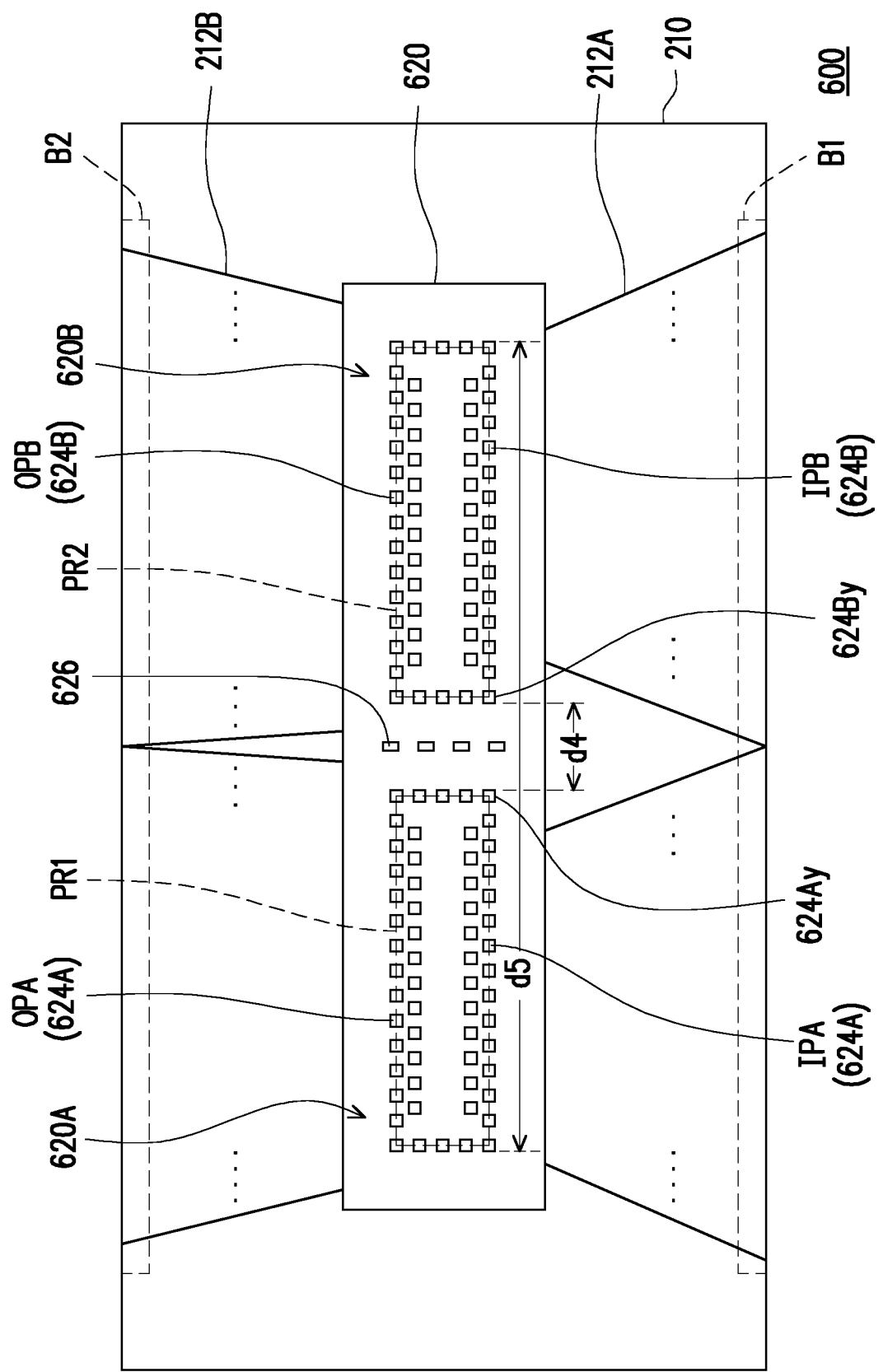
FIG. 6 schematically illustrates a plane view of a portion of a flip chip package according to still another embodiment of the disclosure.

FIG. 6 schematically illustrates a plane view of a portion of a flip chip package according to still another embodiment of the disclosure. In the embodiment of FIG. 6, a flip chip package 600 is similar to the flip chip package 200 and the same or similar components in the two embodiments are indicated by the same or similar reference numbers. Details of these components may refer to the above descriptions and are not reiterated here. In the embodiment, the flip chip package 600 may include a substrate 210 and a chip body 620 bonding on the substrate 210 through a plurality of bumps (not shown in FIG. 6, but may refer to the bumps 130 in FIG. 1). The difference between the flip chip package 600 and the flip chip package 200 lies in the design of the chip body 620. Specifically, the chip body 620 does not include the seal ring surrounding the pads in respective package units.

In the embodiment, the substrate 210 includes a plurality of input wires 212A and a plurality of output wires 212B. The chip body 620 includes a first package unit 620A and a second package unit 620B. The first package unit 620A includes a plurality of first pads 624A arranged in a first ring path PR1, and the second package unit 620B includes a plurality of second pads 624B arranged in a second ring path PR2. A distance d4 from one of the first pads 624A, the first pad 624Ay, closest to the second pads 624 to one of the second pads 624B, the second pad 624By, closest to the first pads 624A is in a range of 55 μm to 1000 μm. A distance d5 from one of the first pads 624A farthest from the second pads 624B to one of the second pads 624B farthest from the first pads 624A may be in a range of 28 mm to 66 mm.

Each of the input wires 212A has one end overlapping the chip body 620 and the other end positioned at a first bonding region B1 of the substrate 210, each of the output wires 212B has one end overlapping the chip body 620 and the other end positioned at a second bonding region B2 of the substrate 210 and the first bonding region B1 and the second bonding region B2 are located at opposite sides of the chip body 620. The first pads 624A may include a plurality of first input pads IPA, the second pads 624B may include a plurality of second input pads IPB, the first input pads IPA are respectively connected to a portion of the input wires 212A, and the second input pads IPB are respectively connected to the other portion of the input wires 212A. In some embodiments, one or more of the first pads 624A positioned more adjacent to the second pads 624B than the first input pads IPA connecting to the input wires 212A may be dummy pad(s), similar to the first dummy pads DPA in FIG. 3, and one or more of the second pads 624B positioned more adjacent to the first pads 624A than the second input pads IPB connecting to the input wires 212A may be dummy pad(s), similar to the second dummy pads DPB in FIG. 3.

In addition, the chip body 620 may further include a peripheral circuit 626 positioned at a region between the first pads 624A and the second pads 624B. In some embodiments, one of the first pads 624A and one of the second pads 624B may be connected through an interconnecting bump similar to the interconnecting bump 432 shown in FIG. 4 or through an interconnecting wire similar to the interconnecting wire 216 shown in FIG. 5.

In light of the foregoing, a flip chip package in accordance with an embodiment of the disclosure including the chip body having two or more package units encapsulated in a single package may provide more output channels and facilitates the application of high resolution electronic devices. The flip chip package in accordance with an embodiment of the disclosure may be fabricated by one bonding step, so that manufacture of the flip chip package is not complicated for having multiple package units in one single chip body. In addition, the single chip body in accordance with an embodiment of the disclosure integrally includes two package units so as to have a compact volume.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A flip chip package, comprising:
   a substrate comprising a plurality of input wires and a plurality of output wires;
   a chip body bonding on the substrate, wherein the chip body comprises a first package unit and a second package unit, the first package unit comprises a first seal ring and a plurality of first pads positioned inside a region surrounded by the first seal ring, the second package unit comprises a second seal ring and a plurality of second pads positioned inside a region surrounded by the second seal ring, and the chip body extends continuously between the first seal ring and the second seal ring; and
   a plurality of bumps connected between the chip body and the substrate,
   wherein each of the input wires has one end overlapping the chip body and the other end positioned at a first bonding region of the substrate, each of the output wires has one end overlapping the chip body and the other end positioned at a second bonding region of the substrate, and the first bonding region and the second bonding region are located at opposite sides of the chip body.

2. The flip chip package according to claim 1, wherein the first pads are arranged in a ring path inside the region surrounded by the first seal ring.

3. The flip chip package according to claim 1, wherein the first pads are arranged in a ring path surrounded by the second seal ring.

4. The flip chip package according to claim 1, wherein one of the bumps is an interconnecting bump extending between the first package unit and the second package unit, one end of the interconnecting bump is connected to one of the first pads and the other end of the interconnecting bump is connected to one of the second pads.

5. The flip chip package according to claim 1, wherein the substrate further comprises an interconnecting wire, the interconnecting wire is connected to one of the first pads and one of the second pads.

6. The flip chip package according to claim 1, wherein the first seal ring and the second seal ring are spaced from each other by a distance and the distance ranges from 50 μm to 200 μm.

7. The flip chip package according to claim 1, wherein the first pads comprises a plurality of first input pads, the second pads comprises a plurality of second input pads, the first input pads are respectively connected to a portion of the input wires, and the second input pads are respectively connected to the other portion of the input wires.

8. The flip chip package according to claim 7, wherein one of the first pads is a first dummy pad positioned more adjacent to the second seal ring than the other of the first input pads and one of the second pads is a second dummy pad positioned more adjacent to the first seal ring than the other of the second input pads.

9. The flip chip package according to claim 1, wherein a length of the chip body ranges from 28 mm to 66 mm.

10. The flip chip package according to claim 1, wherein a distance from one of the first pads farthest from the second seal ring to one of the second pads farthest from the first seal ring is in a range of 27 mm to 65 mm.

11. The flip chip package according to claim 1, wherein a distance from one of the first pads closest to the second seal ring to one of the second pads closest to the first seal ring is in a range of 55 μm to 1000 μm.

12. The flip chip package according to claim 1, wherein the chip body further comprises a peripheral circuit positioned between the first seal ring and the second seal ring.

13. A flip chip package, comprising:
   a substrate comprising a plurality of input wires and a plurality of output wires;
   a chip body bonding on the substrate, wherein the chip body comprises a first package unit and a second package unit, the first package unit comprises a plurality of first pads arranged in a first ring path, the second package unit comprises a plurality of second pads arranged in a second ring path, and a distance from a closest one of the first pads closest to the second pads to a closest one of the second pads closest to the first pads is in a range of 55 μm to 1000 μm; and
   a plurality of bumps connected between the chip body and the substrate,
   wherein each of the input wires has one end overlapping the chip body and the other end positioned at a first bonding region of the substrate, each of the output wires has one end overlapping the chip body and the other end positioned at a second bonding region of the substrate, and the first bonding region and the second bonding region are located at opposite sides of the chip body.

14. The flip chip package according to claim 13, wherein one of the bumps is an interconnecting bump extending between the first package unit and the second package unit, one end of the interconnecting bump is connected to one of the first pads and the other end of the interconnecting bump is connected to one of the second pads.

15. The flip chip package according to claim 13, wherein the substrate further comprises an interconnecting wire, one end of the interconnecting wire is connected to one of the first pads and the other end of the interconnecting wire is connected to one of the second pads.

16. The flip chip package according to claim 13, wherein a length of the chip body ranges from 28 mm to 66 mm.

17. The flip chip package according to claim 13, wherein a distance from a distal one of the first pads farthest from the second pads to a distal one of the second pads farthest from the first pads is in a range of 27 mm to 65 mm.

18. The flip chip package according to claim 13, wherein the chip body further comprises a peripheral circuit positioned at a region between the first pads and the second pads.

19. The flip chip package according to claim 13, wherein the first pads comprises a plurality of first input pads, the second pads comprises a plurality of second input pads, the first input pads are respectively connected to a portion of the input wires, and the second input pads are respectively connected to the other portion of the input wires.

20. The flip chip package according to claim 19, wherein one of the first pads is a first dummy pad positioned more adjacent to the second pads than the first input pads and one of the second pads is a second dummy pad positioned more adjacent to the first pads than the second input pads.

\* \* \* \* \*